United States Patent [19]
Georger, Jr. et al.

[11] Patent Number: 5,342,737
[45] Date of Patent: Aug. 30, 1994

[54] HIGH ASPECT RATIO METAL MICROSTRUCTURES AND METHOD FOR PREPARING THE SAME

[75] Inventors: Jacque H. Georger, Jr., Marlboro, Mass.; Martin C. Peckerar, Silver Spring; Milton L. Rebbert, Elkridge, both of Md.; Jeffrey M. Calvert, Alexandria; James J. Hickman, McLean, both of Va.

[73] Assignees: The United States of America as represented by the Secretary of the Navy, Washington, D.C.; Geo-Centers, Inc., Newton Centre, Mass.

[21] Appl. No.: 874,403

[22] Filed: Apr. 27, 1992

[51] Int. Cl.$^5$ .............................. G03C 5/00
[52] U.S. Cl. .................. 430/324; 430/325; 430/326; 430/329; 437/17; 138/177; 414/910
[58] Field of Search ............... 430/324, 325, 326, 329; 437/17; 138/177; 414/910

[56] References Cited

U.S. PATENT DOCUMENTS 4,687,730 8/1987 Eron ..................................... 430/324

FOREIGN PATENT DOCUMENTS 0005522 1/1990 Japan .

OTHER PUBLICATIONS

Analytical Chemistry, vol. 59, No. 21, Nov. 1, 1987, pp. 2625–2630, R. M. Penner, et al., "Preparation and Electrochemical Characterization of Ultramicroelectrode Ensembles".
J. Appl. Phys., vol. 57, No. 11, Jun. 1, 1985, pp. 5011–5016, D. A. Kirkpatrick, et al., "High Brightness Electrostatically Focused Field Emission Electron Gun for Free Electron Laser Applications".
Sov. Phys. Tech. Phys., vol. 32. No. 1, Jan. 1987, pp. 50–54, A. G. Nikonov, et al., "Production of Intense Microsecond Electron Beams in a Magnetron Diode".
Journal of Physical Chemistry, vol. 89, No. 25, 1985, pp. 5537–5541, M. Fleischmann, et al., "The Behavior of Microring Electrodes".
Analytical Chemistry, vol. 60, No. 19, Oct. 1, 1988, pp. 2016–2020, R. A. Saraceno, et al., "Electron Transfer Reactions of Catechols at Ultrasmall Carbon Ring Electrodes".
J. Appl. Phys., vol. 62, No. 5, Sep. 1, 1987, pp. 1564–1567, G. Bekefi, et al., "Temporal Evolution of Beam Emittance From a Field-Emission Electron Gun".
IEEE, W. Ehrfeld, et al., "Fabrication of Microstructures Using the LIGA Process", 11 pages.
Fortune, Dec. 2, 1991, p. 132, D. Kirkpatrick, "A Novel Way to Make Video Screens Flat".

Primary Examiner—John Kight, III
Assistant Examiner—Duc Truong
Attorney, Agent, or Firm—Oblon, Spivak, McClelland, Maier & Neustadt

[57] ABSTRACT

High aspect ratio metal microstructures may be prepared by a method involving
(i) forming a layer of a photoresist on a substrate;
(ii) exposing the layer to actinic radiation in an imagewise manner and developing the exposed layer to obtain a surface which contains regions having no remaining photoresist and regions covered with photoresist;
(iii) metallizing the surface to form a layer of metal on the region of the surface having no remaining photoresist and on the sides of the regions of photoresist remaining on the surface; and
(iv) optionally, stripping the photoresist remaining on the surface.

Such microstructures are useful as electron emitters, anisotropic high dielectric interconnects, masks for x-ray photolithography, carriers for the controlled release of active agents, and ultramicroelectrode arrays.

8 Claims, 8 Drawing Sheets

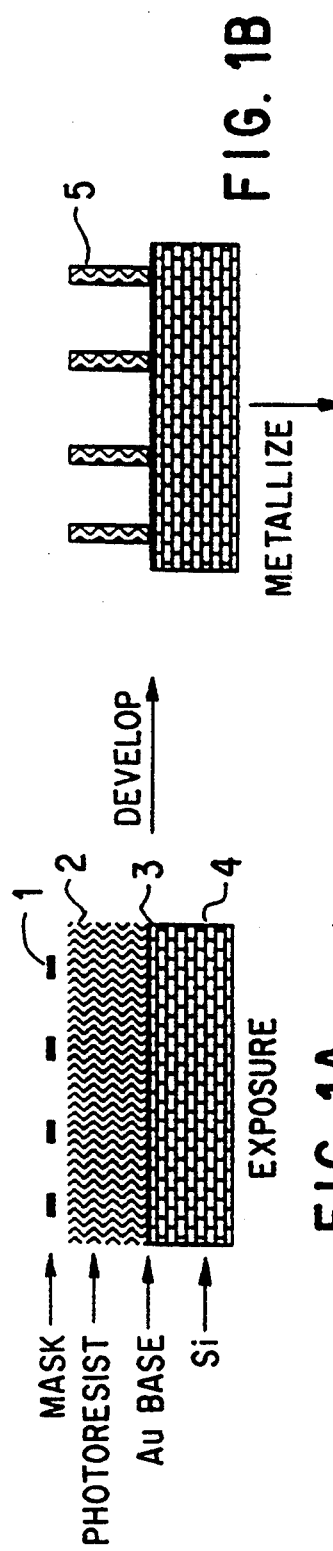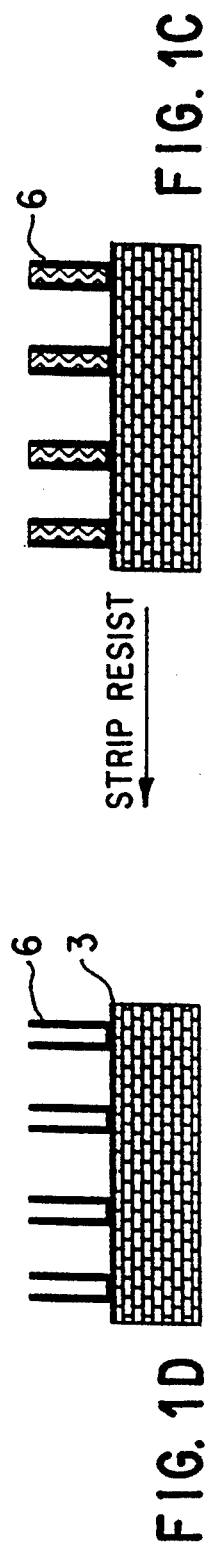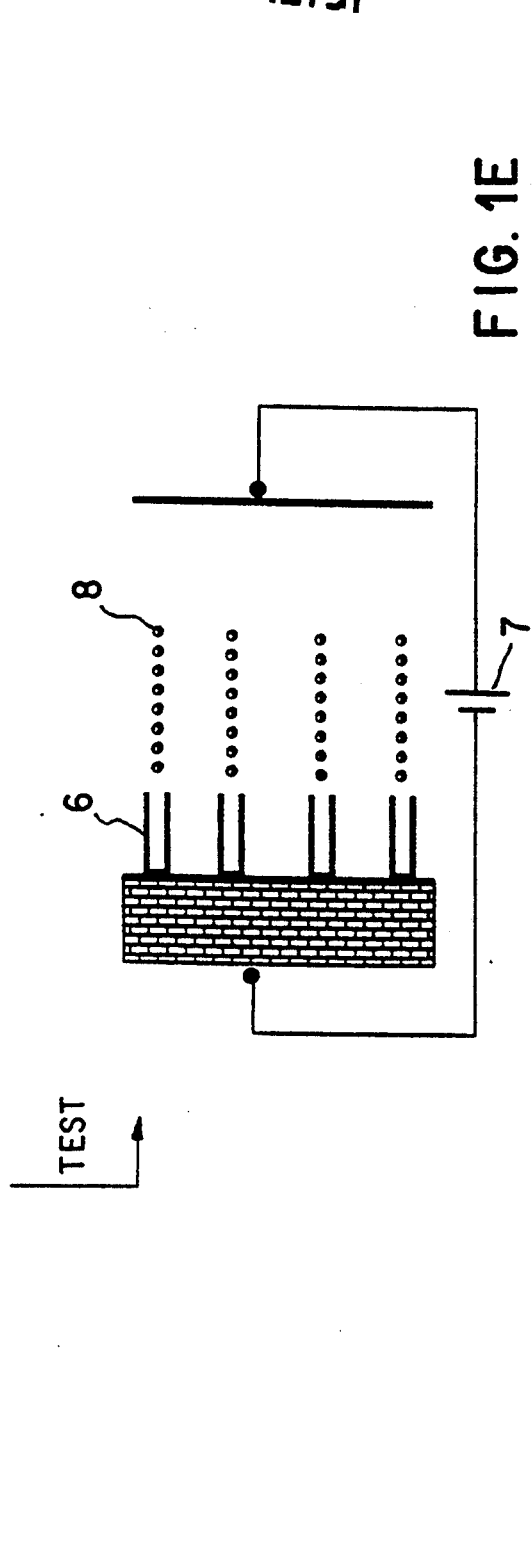

1μm

5μm

5μm 2.42μm

10μm

10μm

20μm

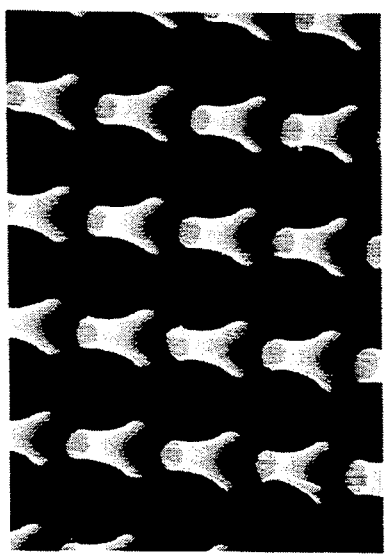
FIG. 6A 10μm
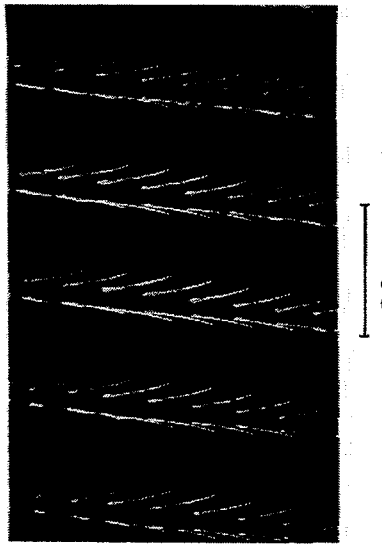
FIG. 6C 20μm
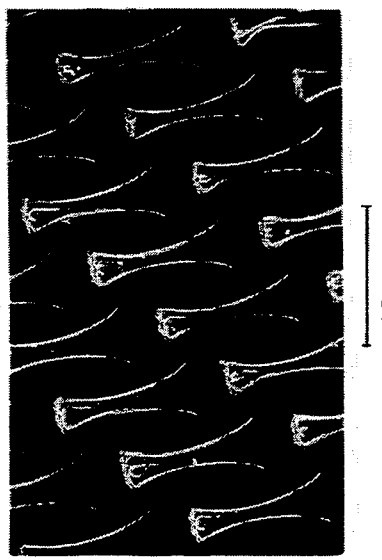
FIG. 6B 10μm

HIGH ASPECT RATIO METAL MICROSTRUCTURES AND METHOD FOR PREPARING THE SAME

BACKGROUND OF THE INVENTION

1. Field of the Invention

The present invention relates to high aspect ratio metal microstructures and methods for preparing such high aspect ratio metal microstructures.

2. Discussion of the Background

There are a variety of important military and industrial applications for high resolution metal microstructures with good adhesion on a variety of technologically relevant surfaces. These include interconnects and vias in silicon based microcircuits as well as high resolution conductive paths on printed circuit boards, packaging, microwave transmitters and receivers.

These are also a variety of application for high resolution metal microstructures with high aspect ratios. These include electron beam sources which make possible the fabrication of high power microwave devices, free electron lasers, projection electron beam lithographic sources and flat panel displays. Other applications for high resolution high aspect ratio structures include x-ray masks, self shielding interconnects, controlled release microvials, microelectrodes and scanning tunneling electron tips.

Recently there has been a large amount of interest in vacuum field emission from arrays of sharp tips (T. Utsumi, *IEEE Trans. Elctron Devices*, vol. 38, p. 2276 (1991)). This is because of their potential use in vacuum microelectronics (C.A. Spindt, etal, *J. Appl. Phys.*, vol. 47, p. 5248 (1976)), flat panel displays (*Fortune*, Dec. 2, 1991, p. 132) high power switches (C.W. Roberson, *Proc. Soc. Photo-Opt. Int. Eng.*, vol. 453, p. 320 (1983)), etc. Another geometry has recently been reported that makes use of metal-coated biologically derived cylinders for free electron laser applications (Kirkpatrick etal, *Applied Phys. Lett.*, vol. 60, p. 1556 (1992); and Kirkpatrick et al, *Nuclear Instruments and Methods in Phys. Res.*, Elsevier, NY, p.1, (1991)). Numerical modeling has shown that electron beam brightness for a hollow cylinder geometry should be superior to that of a sharp tip. However, problems with the biologically derived cylinders fabrication process severely limits their performance.

The Fowler-Nordheim, (Fowler et al, *Proc. R. Soc. London A*, vol. 119, p-173 (1928)) field emission current density, $J_{FN}$, describes the process of quantum filed emission from a onedimensional cold-cathode system, $$J_{FN} = \frac{A(\beta E)^2}{\phi t^2(y)} \exp\left(-B \cdot \frac{\phi^{3/2} v(y)}{\beta E}\right) A/cm^2 \quad (1)$$

where $A=1.54 \times 10^{-6}$, $B=6.87 \times 10^7$, $y=3.79 \times 10^{-4}(\beta E)^{\frac{1}{2}}/\phi$, $t^2(y)=1.1$, $v(y)=0.95-y^2$, $\beta$ is the field enhancement factor due to local geometry, E is the applied electric field in V/cm, and $\phi$ is the work function in $\theta V$ of the surface emission material. Precise values for $t^2(y)$ and $v(y)$ are reported in the literature (Miller, *J. Franklin Inst.*, vol. 282, p. 382 (1966), and Miller, *J. Franklin Inst.*, vol. 287, p. 347 (1969)).

Hollow cylinders can be used to produce a local enhance ment of the applied electric field whose magnitude is dependent upon cylinder height, the average spacing between nearest neighbors, the radius of curvature of the metal wall at the edge of the exposed hollow cylinder, and the nature of the surface near the exposed edge. Detailed numerical simulations (Kirkpatrick et al, *Nuclear Instruments and Methods in Phys. Res.*, Elsevier, NY, p.1, (1991)) of the electrostatic field in the vicinity of a hollow cylindrical structure have shown that field enhancement factors in the range $\beta=150-250$ may be readily achieved with a cylinder of diameter 0.5 $\mu$m and a height h=10-15 $\mu$m. The enhancement factor may be increased an additional 2- to 4-fold by the inherent surface roughness of the elctrolessly deposited metal film that makes up the outer cylinder surface, yielding an enhancement factor in the range $\beta=300-1000$.

The hollow nature of the protruding tubule microstructures also provides an electrostatic lensing effect for the emitted electrons: the thinner the tubule wall, the greater the self-focusing effect of the structure, and the more collimated the emitted bean. For suitably fabricated structures, with thin wall thicknesses near the emission tip, normalized electron beam brightnesses well in excess of $10^6$ A/cm$^2$-rad$^2$ can be achieved (Miller, J. *Franklin Inst.*, vol 287, p.347 (1969)).

However, to date no approaches have proven suitable for producing field emitter arrays (FEAs) with the above structural and functional characteristics- In addition, no technique for the production of high aspect ratio metal microstructures has been demonstrated that has the ability to precisely control the height, diameter, center to center spacing, alignment, metal type, and metal thickness required for these devices.

In addition, it is desirable to -use x-rays as the source of actinic radiation in photolithographic techniques, because the short wavelengths of such radiation provides increased resolution. To fully realize the increased resolution potentially afforded by x-ray photolithography, masks which contain structural details on the order of about 10 to 0.01 $\mu$m in width are desired. Further to permit the use of such penetrating irradiation, masks with a stopping power equivalent to about 1-3 $\mu$m of a metal such as gold or nickel are required. However, to date masks which combine the desired fineness of structural detail and the required stopping power have not been available. High aspect ratio metal microstructures having heights of about 1 to 3 $\mu$m and structural details having widths of 1 to 0.01 $\mu$m, if available, would thus be useful as masks for x-ray photolithography.

Recently, the use of microtubules as carriers for the controlled release of active compounds, such as antifouling agents, pesticides, antibiotics, etc., has been reported. Thus, high aspect ratio metal microstructures which are in the form of tubules having one or two open ends would be useful as carriers for the controlled release of active agents. However, the production of such microtubules remains problematic, especially for those with only one open end.

In addition, the ability to prepare anisotropic high dielectric interconnects between one or more microcircuits on separate layers of a semiconductor or similar device with the desired packing of today's dense microciruucits remains an elusive goal. If it were possible to precisely, place metal structures with heights of 0.5 to 5 $\mu$m and widths of 0.5 to ~4 $\mu$m on the surface of a device, such metal structures could serve as highly anisotropic interconnects between a circuit on the layer on which the structures are placed and a circuit on a layer subsequently added with an increase in shielding of the electron field between two different circuits in close proximity. For a general discussion of metal features and pillars in multilevel interconnect metallization, see Vivek D. Kulkarni et al, *J. Electrochem. Soc. Solide State Sci. and Tech.*, vol. 135, no. 12, pp. 3094–98, (1988).

It is also desirable to provide ultramicroelectrode arrays (UMAs) for use as sensors, e.g., in solid state electrochemistry. The benefits attending such electrodes have been discussed by Fleischmann et al, *J. Phys. Chem.*, vol. 89, pp. 5537–5541 (1985). In particular, it is desired to prepare addressable ring microelectrodes with metal line width dimensions on the order of 500 to 1000 Å. However, the production of such devices is currently unachievable. Penner et al, *Anal. Chem.*, vol. 59, pp. 2625–2630 (1987) report the production of ensembles of ultramicroelectrodes. However, the electrodes are neither regularly spaced nor arranged substantially parallel to one another. Thus, if it were possible to prepare regularly spaced addressable metal microstructures with such dimensions, such metal microstructures could serve as UMAs.

Thus, there remains a need for high aspect ratio metal microstructures which would be useful as anisotropic interconnects, electron emitters, x-ray photolithography masks, ultramicroelectrode arrays, and carriers for the controlled release of active agents. There also remains a need for a method of producing such high aspect ratio metal microstructures.

SUMMARY OF THE INVENTION

Accordingly, one object of the present invention is to provide novel high aspect ratio metal microstructures.

It is another object of the present invention to provide a method for producing such high aspect ratio metal microstructures.

It is another object of the present invention to provide novel electron emissive surfaces.

It is another object of the present invention to provide a method for producing such electron emissive surfaces.

It is another object of the present invention to provide novel masks for x-ray photolithography.

It is another object of the present invention to provide novel carriers for the controlled release of active compounds.

It is another object of the present invention to provide a method for preparing such carriers for the controlled release of active compounds.

It is another object of the present invention to provide novel anisotropic high dielectric interconnects.

It is another object of the present invention to provide devices which contain anisotropic high dielectric interconnects.

It is another object of the present invention to provide a method for producing such interconnects and devices containing such interconnects.

It is another object of the present invention to provide ultramicroelectrode arrays.

It is another object of the present invention to provide a method for preparing such ultramicroelectrode arrays.

These and other objects, which will become apparent in the course of the following detailed description, have been achieved by the inventors' discovery that high aspect ratio metal microstructures may be prepared by a process involving:

(i) forming a layer of a photoresist, which is amenable to the adhesion of electroless plating catalyst or can be treated such that the surface promotes the adhesion of the catylist, on a substrate;

(ii) exposing the layer to actinic radiation in an imagewise manner and developing the exposed layer to obtain a surface which contains regions having no remaining photoresist and regions covered with photoresist;

(iii) metallizing the surface to form a layer of metal on the region of the surface having no remaining photoresist and on the sides of the regions of photoresist remaining on the surface; and (iv) optionally, stripping the photoresist remaining on the surface.

Thus, the present invention employs advanced optical lithography to form high aspect ratio posts on a substrate. Metallization of the posts is accomplished by use of a selective micro-metallization process. The dimensions of the structures that can be produced by this approach are determined by the thickness of the resist or height of the resist microstructures, the width of the resist microstructures and the thickness of the metal overcoat. The cylinders that have been fabricated using this process are up to 24 microns in height and range from about 1 to 13 microns in diameter. The wall thickness is controllable and existing samples with ~800 Å thickness have been produced (yielding an approximate radius of curvature at the cylinder rim of 400 Å). The variability of the metal cylinder parameters appears to be well within or exceed the acceptable tolerances for many of the applications listed above.

It is also possible to metalize any resist microstructure having a geometry other than a cylinder, such as, e.g., squares, lines, ovals, etc.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 1 diagrams one embodiment of the present method as a flowsheet;

FIGS. 4–6 are scanning electron micrographs of microcylinders according to the present invention;

DETAILED DESCRIPTION OF THE PREFERRED EMBODIMENTS

Figure 2B:
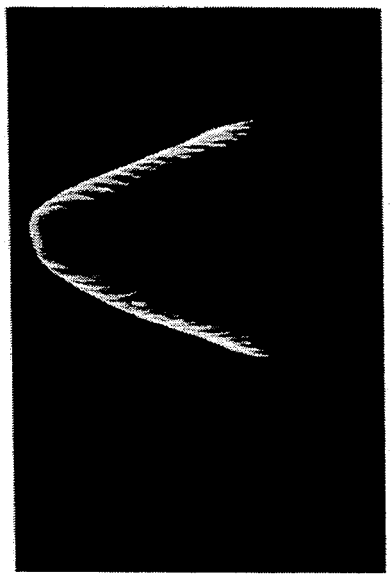
FIGS. 2a–d are scanning electron micrographs of high aspect ratio metal microstructures according to the present invention.
Figure 2D:
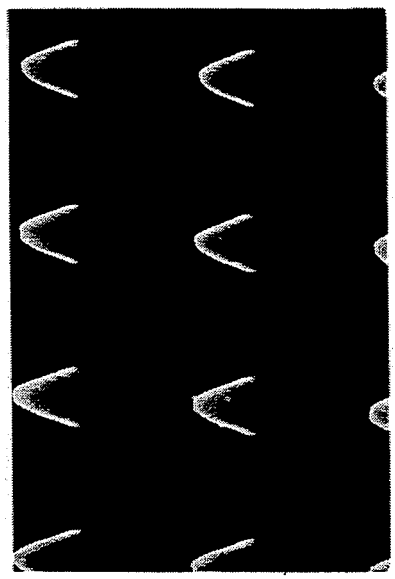
Figure 2A:
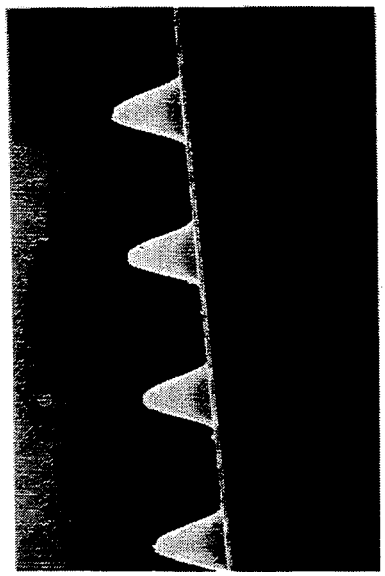
Figure 2C:
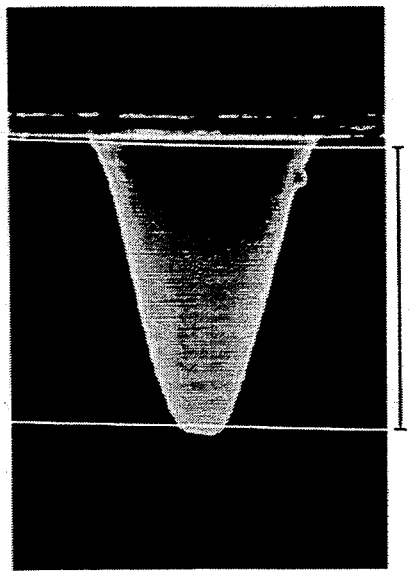

Thus, the present invention, in one embodiment, relates to high aspect ratio metal microstructures- By the term high aspect ratio is meant structures in which the longest dimension is at least 1 times the shortest dimension. In one preferred embodiment the present metal microstructure is in the shape of a cylinder. In this case, it is preferred that the greater dimension be the length of the cylinder and that the lesser dimension be the outer diameter of the cylinder. Although the exact preferred dimensions of such cylinders will, in part, depend on the intended use of the cylinders, generally such cylinders will have lengths ranging from about 1 to 30 μm and outer diameters ranging from about 0.25 to 30 μm. Thus, the aspect ratio of such cylinders is typically at least 1 to 30. Much higher aspect ratios have been achieved using conventional x-ray lithography techniques and thick x-ray resists. These structures can be prepared with nearly identical base and tip dimensions without any tapering and with heights as tall as 200μm.

The present microstructures may be in the shape of a hollow cylinder with either one or two open ends. In this case, the length and outer diameter of the cylinder are as described above, and the inner diameter is generally 0.25 to 30 μm and the cylinder wall thickness is typically 500 to 10,000 Å.

The metal which comprises the present microstructures may be any that may be suitably employed in the present process of preparing the present microstructures. Thus, the metal may be any that may be utilized in the metallizing step described below. Such metals and the corresponding plating baths are disclosed in U.S. Pat. No. 5,079,600; *Science,* v. 252, 551(1990); *Solid State Tech.,* vol. 34(10), p. 77(1991); *Proc. MRS Spring* 1992 *Mtg.,* Paper C8.22, and *Proc. MRS Spring* 1992 *Mtg.,* paper C12.3, all of which are incorporated herein by reference. Further, the present microstructures may include layers of metals subsequently applied to the first metal layer, by techniques such as vapor deposition and other techniques discussed *Thin Film Processes,* Vossen, ed., Academic Press, NY(1978). It should be understood that the final microstructure may include layers of metal alloys which are formed by alloying two or more metals which are layered in the same or different steps and alloyed by a subsequent procedure, such as a heat treatment. It should also be understood that the present metal microstructures include those which contain one or more metal oxide layers and/or small amounts of residual photoresist or plating bath components. The microstructures may also contain small amounts of other materials arising from surfactants and other additives present in the resist.

As noted above, the present microstructures may be used as a carrier for the controlled release of active agents. The use of microtubules as carriers for the controlled release of active agents is described in U.S. patent application Ser. Nos. 07/343,762, filed on Apr. 14, 1989 and 07/668,772, filed on Mar. 11, 1991, which are incorporated herein by reference. In this case, the microstructures are preferably hollow cylinders with either one or two open ends. Preferably these cylinders have a length of 1 to 30 μm, an outer diameter of 0.25 to 5 μm, an inner diameter of 0.25 to 5 μm, and a wall thickness of 500 to 10,000 Å.

In another embodiment, the present microstructures may comprise an electron emissive surface. In this case, the microstructures preferably comprise an array of hollow microcylinders arranged on a conductive surface such that the lengthwise dimension of each microcylinder is perpendicular to the conductive surface. Preferably, the microcylinders are 3 to 30 μm in height, 0.25 to 10 μm in outer diameter, 0.25 to 10 μm in inner diameter, 500 to 10,000 Å in wall thickness, and arranged such that the center to center distance for nearest neighbors is about 5 to 50 μm, and all structures are of uniform height. Preferably, the present electron emissive device is structured such that there is a low-resistance path between the conductive substrate (power source) and the microstructure tips. It has been found that this is achieved in devices which are substantially free of any high-resistance layer, such as an oxide, including metal oxide layer, between the microcylinders and the conductive substrate (power source). The presence of such a layer may lead to the destruction and ejection from the surface of the microcylinders when a potential is applied. It should be understood that the presence of a high-resistance region (an oxide layer) per se in the present device may not necessarily lead to the destruction of the device. Thus, it is only when the high resistance region blocks a low resistance pathway between the conductive surface (power source) and the emitting surface that destruction may occur. Accordingly, the presence of a high resistance region may be tolerated or even desired in the present device so long as it does not preclude a low resistance pathway between the conductive substrate (power source) and emitting surface.

The present electron emissive surfaces may be operated by applying a potential across the microcylinders as shown in FIG. 2. Typically, electron emission will be achieved with potentials ranging from 50 to 200 KV/cm. Such potentials may be applied by conventional techniques as described in, e.g., Kirkpatrick et al, *Applied Phys. Lett.,* vol. 60, p. 1556 (1992), and Kirkpatrick et al, *Nuclear Instruments and Methods in Phys, Res.,* Elsevier, NY, p.1, (1991), both of which are incorporated herein by reference. The microcylinders of the present electron emissive surfaces may be addressed, in whole, in groups, or individually, by designing the mask used to fabricate the resist posts such that the posts are aligned with conductive pads or pathways that were previously built into the substrate using conventional IC fabrication techniques.

As noted above, the present electron emissive surfaces may be used in devices such as high power microwave devices, free electron lasers, projection electron beam lithographic sources, and flat panel displays.

In another embodiment, the present invention relates to masks for use in x-ray photolithography. In this case, the final geometry of the high aspect ratio microstructure will be determined by the desired mask image to be utilized in the subsequent x-ray photolithography. Thus, there are no particular constraints placed on the pattern of the present x-ray photolithography masks. It is, however, preferred that the metal microstructure have a height sufficient to provide a stopping power equivalent to 1 to 3 μm of a metal, such as gold. Further, it is also preferred that the metal microstructures possess structural details having widths of 0.01 to 1.0 μm to fully realize the potential high resolution afforded by x-ray photolithography. X-ray masks are typically made on an x-ray transparent membrane such as silicon nitride with high aspect ratio gold microstructures. The mask is placed in proximity of (~25μ) a substrate coated with an x-ray resist and then is exposed to collimated x-rays from a suitable x-ray source (see: *Photoreactive Polymers,* pg. 335–358).

The high aspect ratio metal features block the x-rays in a pattern that is transferred to the resist. The resolution of this pattern is dictated by the width of the metal microstructures. Maintaining the width of the structure from the base to the top is crucial. Making 1–3 μm high metal structures with widths of 0.5–0.01μm has proven very difficult.

With the process described in this patent a 1 μ wide, 3 μm thick photo, electron beam, ion beam, or x-ray resist may be electrolessly plated with a metal of a known thickness by controlling the plating conditions. For example, if the resist was plated with 500 Å of NiB the surface of the substrate and the side walls of the of the resist will be plated to that thickness. The 500 Å on the surface of the substrate will have minimal x-ray blocking capability. However, the 500 Å of metal on the resist sidewalls will have the stopping equivalent of 3 μm of metal, Producing this structure on a suitable x-ray transparent membrane material and then using it as an x-ray mask would result in parallel beams 1 μm apart that are 500 Å in width in conventional x-ray resists.

The present invention also relates to anisotropic interconnects which are useful for connecting a first circuit on one layer of a semiconductor or similar device with a second circuit on a different layer. The present invention also relates to devices containing such interconnects. In this case it is preferred that the interconnect be a high aspect metal microstructure in the form of a metal post attached to a first surface which contains a first circuit. Of course, there may be more than one interconnect attached to the first surface. In the present devices, the volume between the interconnects can be filled with a suitable nonconductive material. Such materials include polyimides, for example. The device also contains at least one additional circuit which is on the surface formed by the top of the interconnect(s) and the top of the layer of nonconductive material residing between the interconnects. The precise relative positioning of the first circuit, the interconnects, and the second circuit may be easily achieved by convention photolithographic layer-to-layer alignment techniques.

In another embodiment, the present invention provides a method for preparing the present high aspect ratio metal microstructures. In particular, the present method involves:

(i) forming a layer of a photoresist on a substrate;
(ii) exposing the layer to actinic radiation in an imagewise manner and developing the exposed layer to obtain a surface which contains regions having no remaining photoresist and regions covered with photoresist;
(iii) metallizing the surface to form a layer of metal on the region of the surface having no remaining photoresist and on the sides of the regions of photoresist remaining on the surface; and
(iv) stripping the photoresist remaining on the surface.

In the first step a layer of photoresist is formed on a support. The support may be any of a great number of materials, and the selection of the support material will depend, in part, on the shape and intended use of the final microstructure. For example, when the microstructure being prepared is a hollow cylinder to be used as a carrier for the controlled release of an active agent, the only requirement placed upon the support is that it be able to accept and bind a layer of a photoresist. Such supports include those composed of stainless steel, copper, silicon, gold, Ti/Ni/Au, GaAs, diamond, plastics i.e., ABS, crosslinked polyvinylphenol resins, polyethylene. Some of theses substrates may require the use of an adhesion promoter for adhesion of the photoresist to the substrate. Examples of such an adhesion promoter are (aminoethylaminomethyl)phenethyl-trimethoxysilane and hexamethyldisilazane. It may also be necessary to treat exposed areas of the substrate to promote metallizatin of these areas if metallization of these areas is desired. This may be accomplished by the method disclosed in U.S. Pat. No. 5,079,600 and U.S. patent application Ser. No. 07/691,565, both incorporated herein by reference.

In contrast, when the microstructures being prepared are to be used as an array for electron emission, it may be preferable to use as the support a highly conductive non-oxidizing metal such as gold or platinum.

Similarly, the photoresist may be any of a great number of compounds, so long as it is capable forming a thin layer on the support, is capable of being patterned by conventional photolithography, electron beam photolithography, ion beam photolithography, x-rays, etc., and is capable of being selectively metallized, on the surfaces which have been exposed as a result of lithography. Additionally, photoresists which are capable of being metallized even on surfaces which have not been exposed as a result of photolighography, may be utilized in certain applications, notably the production of hollow cylinders with one open end. For this application a more robust metallization scheme may be required, such as increased catalyst concentration, contact time, metal bath concentration, and/or temperature.

Practically all resists are capable of being selectively metallized on surfaces exposed, as a result of photolithography, by controlling the metallization conditions. Preferred resists include SAL601®, S1400®, SNR 248®, S 1650® (all products of Shipley Co., Inc. Newtown MA) AZ 4620®, AZ 4400®, and AZ 4903® (all products of Hoescht, Germany). These resists include the novolak based and polyvinylphenol based resins with diazoquinone and acid catalyzed photoactive compounds.

Resists capable of being metallized on all surfaces include polymethylmethacrylate (PMMA) and the resists described above when more robust metallization conditions are used. For a comprehensive list of suitable resists see: *Photoreactive Polymers The Science and Technology of Resists,* A. Reiser, Wiley, NY (1989).

As will be made more explicit below, the thickness of the photoresist layer, in part, determines the long dimension of the present microstructures. Thus, the thickness of the photoresist layer is suitably 200 to 1 μm, preferably 30 to 1 μm. The photoresist layer is typically formed by spinning a layer of the photoresist compound on the support, and the thickness of the photoresist layer may be conveniently controlled in a given thickness range by adjusting the speed and length of time of the spinning and by selecting the solids content of the resist.

The spin speed can be adjusted to vary the film thickness of a given photoresist. There is an optimal range of spin speeds that will give reproducible and uniform films (Elliot, *Microlithography Process Technology for IC Fabrication,* McGraw Hill, NY, p.74–87, (1986)).

A multiple spin technique can be used to build thicker layers of a given photoresist than those allowed by the solids content and spin speed parameters. With the multiple spin technique a single layer of photoresist is spun on to the support. The layer of photoresist is partially baked to harden the base layer so that it will not mix with subsequent photoresist layers. After the bake cycle a second layer of photoresist is applied and spun on the support. Thicker layers of resist can be built by continuing this spin-bake-spin cycle.

There are practical limits to this process. Defect generation of each spin/bake cycle, photoresist edge build up after each spin and cracking and bubbling of the photoresist due to outgassing of the photoresist layers during the bake cycle will effect film uniformity. A typical thick photoresist such as AZ-4903 can be doubled in thickness with a minimum of side effects.

However, other coating techniques have been demonstrated that have produced 100-200 µm of PMMA for x-ray lithography.

After the photoresist layer has been formed, it is patterned by conventional photolithographic techniques. Thus, the photoresist is exposed to actinic radiation in an imagewise fashion by the use of a mask or retical. It should be noted that the choice of pattern in the mask will, at least in part, determine the final geometry of the resulting microstructures. When selective metallization of the surfaces exposed by photolithography of a positive resist is being employed, as in the production of an electron emissive surface, the areas masked in the photolithography step will not be metallized, and the dimensions of the masked areas will directly translate into dimensions between metallized areas. For example, when the photolithography mask is a pattern of circular dots, the diameter of the dots will correspond to the inner diameter of the final hollow microcylinders, e.g., in an electron emissive surface. A mask containing holes could be used to achieve the same result with a negative resist.

After the photoresist layer has been exposed to actinic radiation, it is then developed to remove a portion of the photoresist layer. This development step is carried out using conventional techniques and materials as described in *Photoreactive Polymers The Science and Technology of Resists*, A. Reiser, Wiley, NY (1989) which is incorporated herein by reference. This development step will result in a surface which contains regions from which the photoresist has been removed and regions on which the photoresist remains.

The next step involves metallizing the developed surface. A key feature of the present invention resides in the fact that the sides of the regions of the photoresist remaining on the substrate are metallized. Another key feature of the present invention resides in the fact that the thickness of the layer of metal formed on the sides of the regions of the photoresist remaining on the substrate may be conveniently controlled by adjusting the conditions, e.g., time, temperature, reactant concentrations, of the metallizing step. Thus, it is possible to construct layers of metal which have a height which is determined by the height of the photoresist layer and a width which is controlled by adjusting the metallizing conditions. These metal layers will be formed along the contours of the regions of photoresist remaining on the substrate. For example, if the mask used in the photolithographic step is a pattern of circular dots, the regions of photoresist remaining after development will be a corresponding pattern of circular columns or posts, and the metal microstructures formed on metallization will be a corresponding pattern of hollow cylinders in which each hollow cylinder of metal surrounds a separate post of photoresist.

It should be understood, that by appropriate choice of resist material and careful control of metallization parameters it is possible to achieve metallization on the top surface of the photoresist remaining on the substrate as well as the sides. Thus, when using a photoresist such as PMMA the metallizing step will proceed with the formation of a layer of metal on the top surface of the photoresist. This approach is particularly useful if a hollow cylinder with one open end and one closed end is desired. In contrast, when a resist such as S 1650 ®, AZ 4620 ®, AZ 4406 ®, and AZ 4903 ® is employed, it is possible to achieve metallization on the sides of the remaining photoresist, with substantially no metallization on the top surface of the photoresist. This is accomplished primarily by controlling the metallization conditions, i.e., length of contact time, concentration, and temperature. This approach is useful for the production of arrays of hollow cylinder for electron emissive devices or hollow cylinders with two open ends.

It may also be possible to control the degree of metallization on the exposed surfaces which are parallel to the top surface of the photoresist but between the regions of photoresist remaining on the substrate. Thus, if the photolithography step results in the creation of regions in which the surface of the substrate is exposed, then the ability to achieve metallization in these regions will depend on the ability of the substrate to be metallized. For typical substrates such as gold, oxides treated with self assembly monolayers as described in U.S. Pat. No. 5,079,600, metallization will proceed in these regions without difficulty, resulting in the metal layers along the sides of the photoresist being connected by a layer of metal on the surface of the substrate.

The metallizing step may be carried out using conventional materials and techniques, such as those described in C.R. Shipley, Jr., *Plating and Surface Finishing*, vol. 71, p. 92 (1984), which is incorporated herein by reference. The choice of metal deposited in this step will, in part, depend on the intended application of the final product. For electron emitter arrays, metals such as Ni, Pd, Cu are suitable, and gold, nickel with gold overcoate, and copper with gold overcoat, and platinum are preferred. Carriers for the controlled release of active agents, disclosed in U.S. patent application Ser. No. 07/668,772, incorporated herein by reference, are preferred. For x-ray photolithography masks, Au, Cu, NiB, NiP, Permalloy, and Pd are suitable, and Au is preferred. For anisotropic interconnects, Cu, Au, NiB, NiP, and Pd suitable, and Cu and Au are preferred.

As noted above, the thickness of the metal layer deposited (the smaller dimension of the high aspect ratio microstructure) may be controlled by adjusting the conditions of the metallizing step. Thus, for a typical metallizing bath such as 10% by volume Niposit ® 468 (Shipley) which plates at a rate of ~20 Å/min, the thickness of the layer may be varied from about 100 Å to about 250,000 Å by varying the time of immersion in the metallizing bath from about 5 min to about 12,500 min, at a temperature of about 25°. Faster rates can be achieved by simply increasing the concetration and temperature of the plating bath. The thickness of the metal layer arising from other metallizing solutions may be similarly controlled by adjusting the time and temperature parameters. For particularly fast acting metallizing solutions, it may be necessary to adjust the concentration of one or more reagents in the solution. The thickness of the resulting metal layer may be readily ascertained by resort to scanning electron microscope spectroscopy or Sloan-Dektak profilometer (see *Solid State Tech.*, vol 34, p. 77 (1991)). The ability to control the thickness of the metal layer by adjusting the above described parameters and the ability to determine the thickness of the resulting metal layer are within those possessed by one of ordinary skill.

After the metallization step, the remaining photoresist may be removed by the use of a conventional stripping step. The precise nature of the agents and conditions employed in the stripping step will, of course, depend on the identity of the photoresist employed in the previous steps. However, the suitable and preferred conditions required for stripping any given conventional photoresist are known to those skilled in the art, as evidenced by *Microlithography Process Technology for IC Fabrication*, Elliot, McGraw Hill, NY (1986), which is incorporated herein by reference.

The result of removing the remaining photoresist in the stripping step is to form a surface on which the high aspect ratio metal microstructures remain on the substrate. For some applications, such as electron emitters, x-ray photolithography masks, and anisotropic interconnects, it will be desirable to leave the metal microstructures intact on the substrate. For other applications, such as carriers for the controlled release of active agents, it may be desirable to remove the metal microstructures (microtubules) from the substrate. The removal of the metal microstructures may be achieved by limiting metallization between microstructures and then rinsing the structures off the surface.

The present method is particularly well suited for the production of substrate-mounted devices for the controlled release of an active agent. Such arrays of substrate-mounted microvials would be useful in applications such as substrates used for the topologically (transdermal) delivery of drugs or as substrates that could be immersed in solution or other environments which release an agent at a linear reate for an extended period of time. In addition, the present method is well suited for the production of controlled release devices (microcylinders) which are closed at one end. Since it is expected that, when other parameters are the same, microcyliners with one closed end will release an agent at one half the rate at which microcylinders with two open ends release the same agent, microcylinders with one closed end would be useful to prolong the effect of the active agent. Of course, microcylinder with one closed end could be used in conjunction with those having two open ends.

Even in regard to the production of microcylinders with two ends, the present method offers advantages not found in the conventional approaches for producing microcylinders. Thus, conventional approaches for producing microcylinders suffer from the drawback that the microcylinders produced are not always uniform in length, outer diameter, and inner diameter. In contrast, the present method benefits from the precision offered by photolithographic techniques, and thus, the resulting microcylinders are highly uniform with regard to the length, outer diameter, and inner diameter. Typically, batches of up to about 730 million microcylinders may be prepared, and the dimensions of the microcylinders vary by less 1%. Further, it is also possible to hold the variations in dimensions to less than about 2% even for microcylinders prepared in different batches. Even when using spinning speeds above 3K rpm, to ensure film homogeneity, it is possible to vary the photoresist film thickness between 5 to 15μm.

FIGS. 1a–e provide a schematic representation of one embodiment of the present method. In FIG. 1a, a photolithographic mask 1 consisting of a pattern of circular dots is used to irradiate a layer of photoresist 2 on a gold base 3 on a silicon substrate 4. After development of the irradiated photoresist, a pattern of circular columns (posts) 5 of photoresist is obtained as shown in FIG. 1b. The metallizing step yields the article depicted in FIG. 1c, in which the sides of the photoresist posts are now coated with a layer of metal 6. In this particular embodiment, the photoresist is chosen such that the surfaces exposed by photolithography may be selectively metallized. Thus the tops of the photoresist posts are not coated with layer of metal. FIG. 1d illustrates the product of the removal of the remaining photoresist by stripping. Now hollow microcylinders of metal 6 remain on the gold base 3. The use of the device of FIG. 1d as an electron emitter is shown in FIG. 1e. A potential is applied using a potential source 7, and electrons 8 are emitted from the hollow metal microcylinders 6.

Other features of the invention will become apparent in the course of the following descriptions of exemplary embodiments which are given for illustration of the invention and are not intended to be limiting thereof.

EXAMPLES

Example 1: Field Emitter Array (FEA) Fabrication

Thin film photoresists were fabricated from four different commercially available resists. The photoresists S1650 from Shipley Co. and AZ4400, AZ4620, and AZ4903 from Hoechst AG Corp., were spun on 3 inch antimony doped silicon wafers on a vacuum chuck at varying speeds from 1–4K rpm. The thickness of the resists was measured by surface profilometry and optical interferometry. The resist thickness may be controlled by varying the spin speed. Another observation in this work was that the resist homogeneity decreases dramatically below spin speeds of 3K rpm, for the resists described above. To produce resist films with homogeneous thicknesses of 10 microns or greater, single and multiple 3–4K spins of AZ4903 and AZ4400 resists were carried out.

A cross section of the metal microcylinder fabrication process as shown schematically in FIG. 1. The process starts with a flat substrate such as a silicon wafer or other optically flat substrate, onto which, a photoresist of known thickness is spun as described above. A chrome on fused silica mask is then placed in contact with the resist in a deep UV SUSS MJ3B high pressure Hg/Xe lamp contact printer and exposed with the correct dosage of light to clear the exposed regions of the photoresist after development with the recommended alkaline developer. The development results in resist posts that are the height of the resist thickness (as shown in FIG. 1b) and their center to center spacing, tip, and base diameters should vary as a function of the mask feature spacing and size. As well as the exposure dosage and type of exposure tool used.

Wafers with the photoresist structures were treated with a 3% by volume Cataposit ®44 (Shipley Co.) catalyst solution for 5 min, then rinsed with 0.1M HCl. The catalyzed surfaces were then accelerated with a pH 1 solution of $Na_2PdCl_4 \times 3H_2O$ (83 mg/L) for 4 min (Gulla et al, EP 90-105228.2, (1990)). The wafers were rinsed with dionized water and subsequently immersed in Niposit ®468 (Shipley) EL nickel-boron plating bath, diluted to 10% by volumne of full strength, at 25° C. for times ranging from 30–60 min. The deposition rate for this bath has been shown to be ~20 Å/min. A visually homogeneous Ni deposit was produced over the entire surface of the wafer. After removal from the EL bath, the wafers were rinsed with dionized water and dried under $N_2$. This results in photoresist posts plated with ~800–1000 Å of NiB on the sidewalls and plating on the surface of the substrate but not on the top of the photoresist as shown in FIG. 1c.

Following metallization, the photoresist is removed by placing the substrate in acetone for 1 minute followed by rinsing with water. This results in hollow metal microcylinders perpendicular to the substrate with wall thicknesses that are equal to the plating thickness (see FIG. 1d).

Further processing can be done on the metal microcylinder arrays such as cutting the substrate into individual arrays and then mounting them on copper stubs with silver paint, annealing and plasma etching to reduce surface oxidation, and sputtering of low work function metals like gold, without damage to the microstructures.

Example 2: FEA Property Characterization

Lithographicly defined microstructures were fabricated in 10 microns of AZ4620 and characterized by scanning electron microscopy (SEM). The metallized microstructures fabricated under the conditions described in Experiment 1 are shown in FIGS. 3a–d. These microstructures appear to be non-cylindrical and to be totally metallized, including their tops. The average height of the tallest microstructure arrays fabricated using this procedure was only 2.5 microns, demonstrating that the largest diameter dot sizes (2 micron on 5 micron centers) on this mask are not large enough to fabricate posts all the way through a 10 micron thick photoresist. Four more samples were fabricated using the procedure described in Experiment 1, and these were characterized immediately after metallization by x-ray photoelectron spectroscopy (XPS). The four samples characterized showed no evidence of tin, tin oxide or palladium and showed very little evidence of oxidized nickel at the surface. Other samples of electroless nickel deposited on lithographicly defined photoresists were characterized by XPS, and all samples have shown no evidence of tin, tin oxide, or palladium at the metal surface, demonstrating that these contaminates are not present at the metal surface. However, the nickel oxide content was found to increase with time at the surface. The amount of oxide at the surface can be reduced but not eliminated if the structures are annealed at 300–400° C. for 1 hour, after plating.

A second generation array test mask was then fabricated. This mask is 4×4 inches with 36 chip areas of 1 cm² each. Every chip contains 4–1 mm² arrays of dots of a known diameter on 15 micron centers. The dot diameters start at 3 microns and increase in 1 micron increments to 13 microns and then the chip patterns are repeated again. This test masks has two major functions; first, it is designed so that the relationship of the metallized microstructure size and shape as a function of mask dot size and resist thickness can be determined; and second, the chip size and array dimensions are designed so that the chips can easily be cut out of the wafer for surface characterization and testing of their field emission properties.

Figure 3:
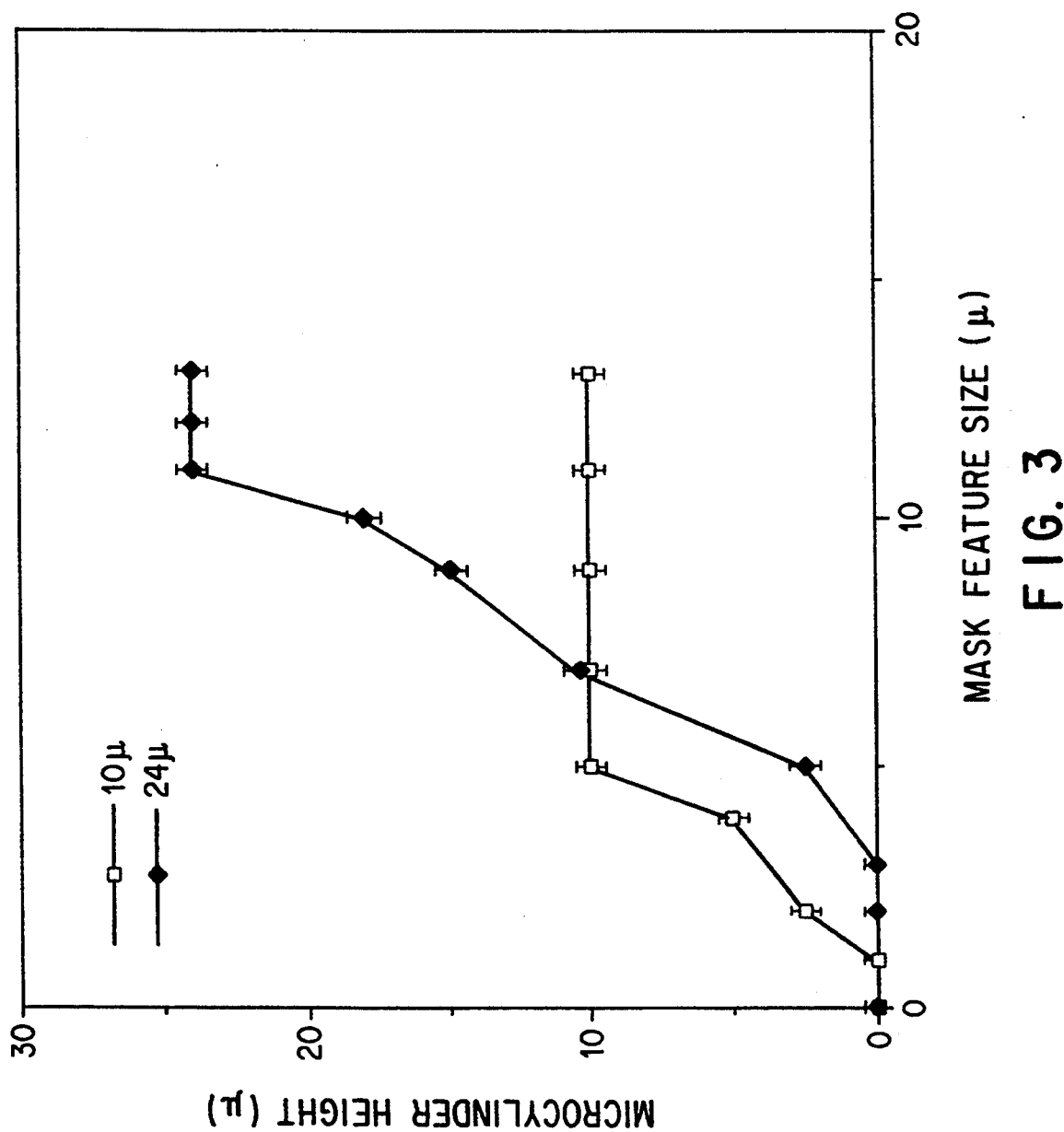
FIG. 3 graphically illustrates the relationship between mask feature size and obtain metal microstructure height for mask dot features printed on a Suss MJ3B vacuum contact printer.

The height of microcylinder arrays fabricated on 3 inch n-type silicon wafers using the second generation test mask and 10 and 24 micron thick photoresists as a function of mask feature size is shown in FIG. 3. The figure shows that mask dot sizes of 5 microns or greater are required to produce structures 10 microns tall in 10 micron thick resist and that mask dot sizes of 10 microns or greater are required to produce structures 24 microns tall in 24 micron thick resists. Tip diameters of the structures range from ~1.5 micron in the 5 micron dot arrays to ~10 microns in the in the 13 micron dot arrays for a 10 micron thick photoresist. Tip diameters range from ~1–6 microns in the 24 micron tall structures.

Microcylinder arrays plated with 800 angstroms of nickel boron were characterized by Scanning Auger Electron Spectroscopy (SAES) to determine the elemental composition of these microstructure arrays as a function of processing. SAES shows that the top of the resist posts have no nickel but do contain small amounts of tin and palladium and that the surface of the metal microcylinder does not contain any tin, or palladium but does contain nickel. Also SAES showed evidence of fluorine at the top surface of the photoresists. The presence of fluorine is presumably due to fluorinated surfactants used in these resists to reduce the striations formed during coating (Elliott, *Microlithography Process Technology for IC Fabrication*, McGraw Hill, NY p. 71 (1986)) and adhesion of the resist surfaces to masks during contact exposures. These surfactants make the surface of the resists extremely hydrophobic and are probably required to prevent the metallization of the top of the photoresist posts.

Figure 4A:
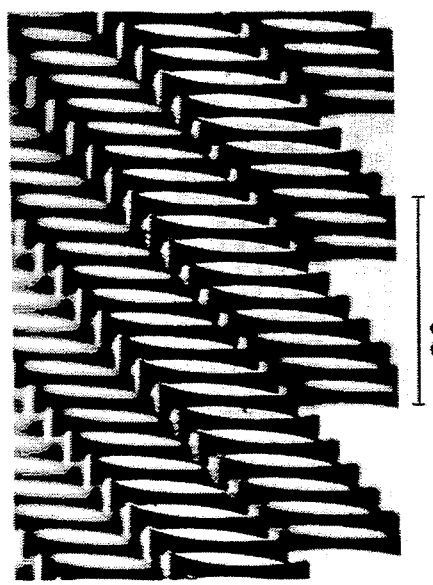
Figure 4C:
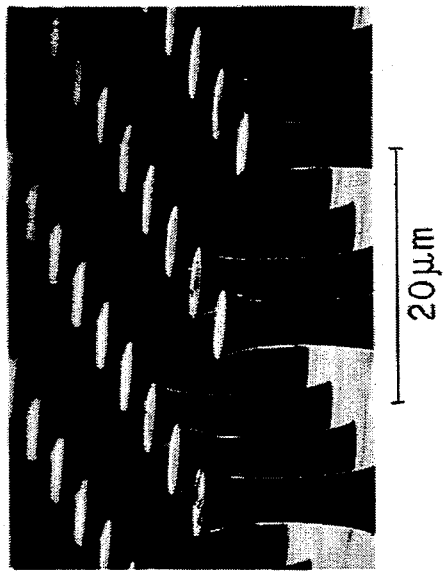
Figure 4B:
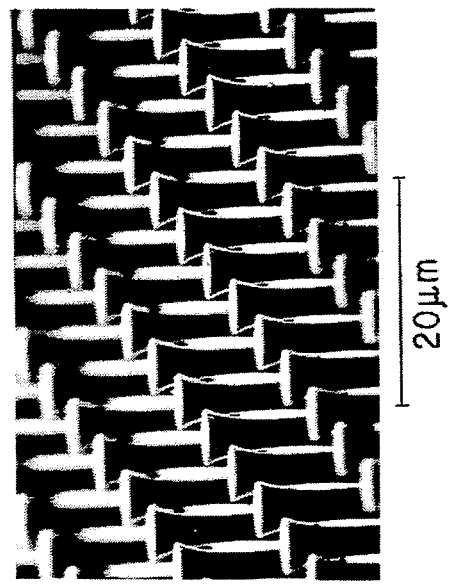
Figure 5A:
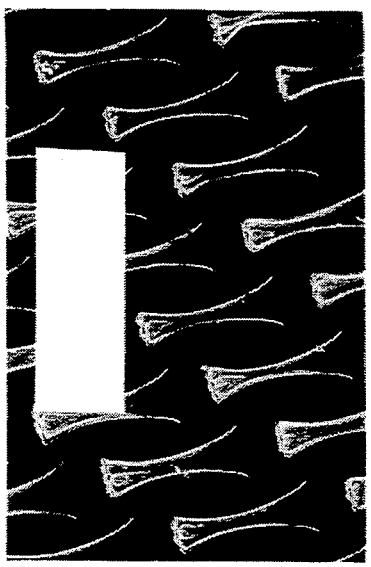
Figure 5C:
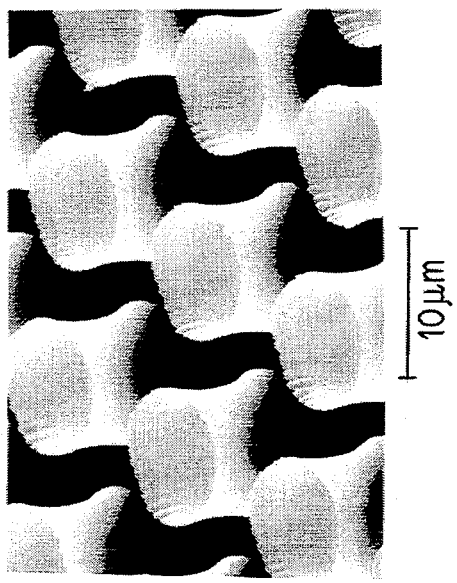
Figure 5B:
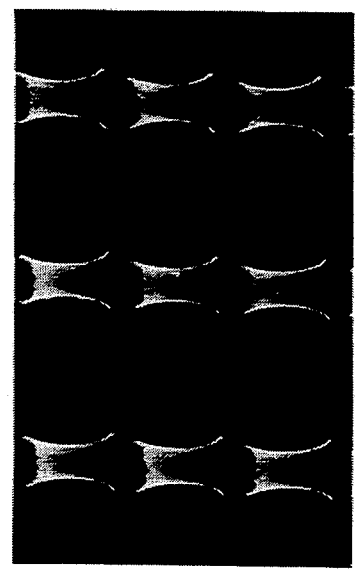
Figure 7B:
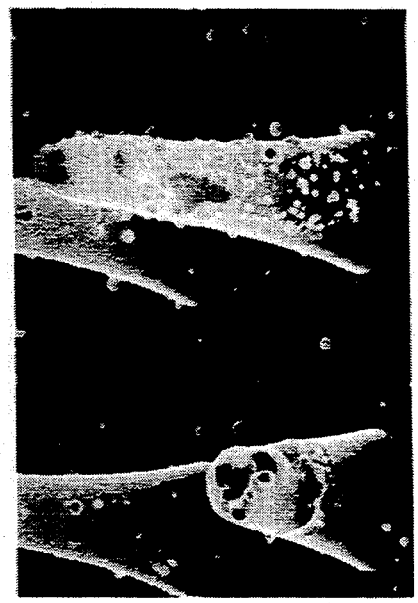
FIG. 7 is a scanning electron micrograph of an array of microcylinders according to the present invention after field emission testing.
Figure 7A:
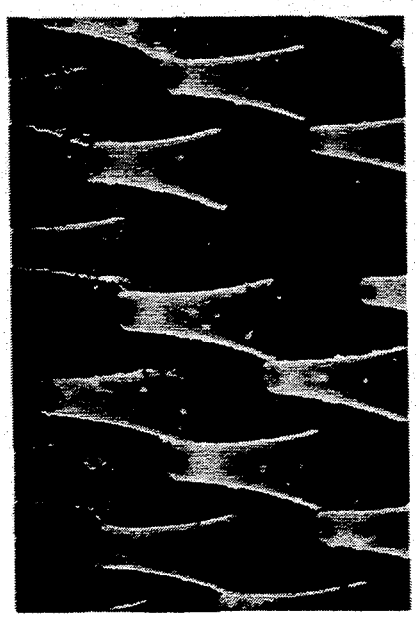

FIGS. 4–6 show SEM micrographs of microcylinder arrays fabricated on antimony doped silicon wafers. These structures were mounted on copper stubs sputtered with gold and tested for field emission. The emission test apparatus and conditions have been described previously (Kirkpatrick et al, *App. Phys. Lett.*, vol. 59, p. 2094, (1991)). Emission from structures with a turn on voltage of 300 Kv/cm and a field enhancement of ~300 was achieved with 17 micron tall, 2 micron tip diameter structures. However, emission from these structures was destructive resulting in melting and ejection of the structures from the surface of the chip. FIG. 7 shows SEMs of the metal microstructures after field emission testing.

Figure 8:
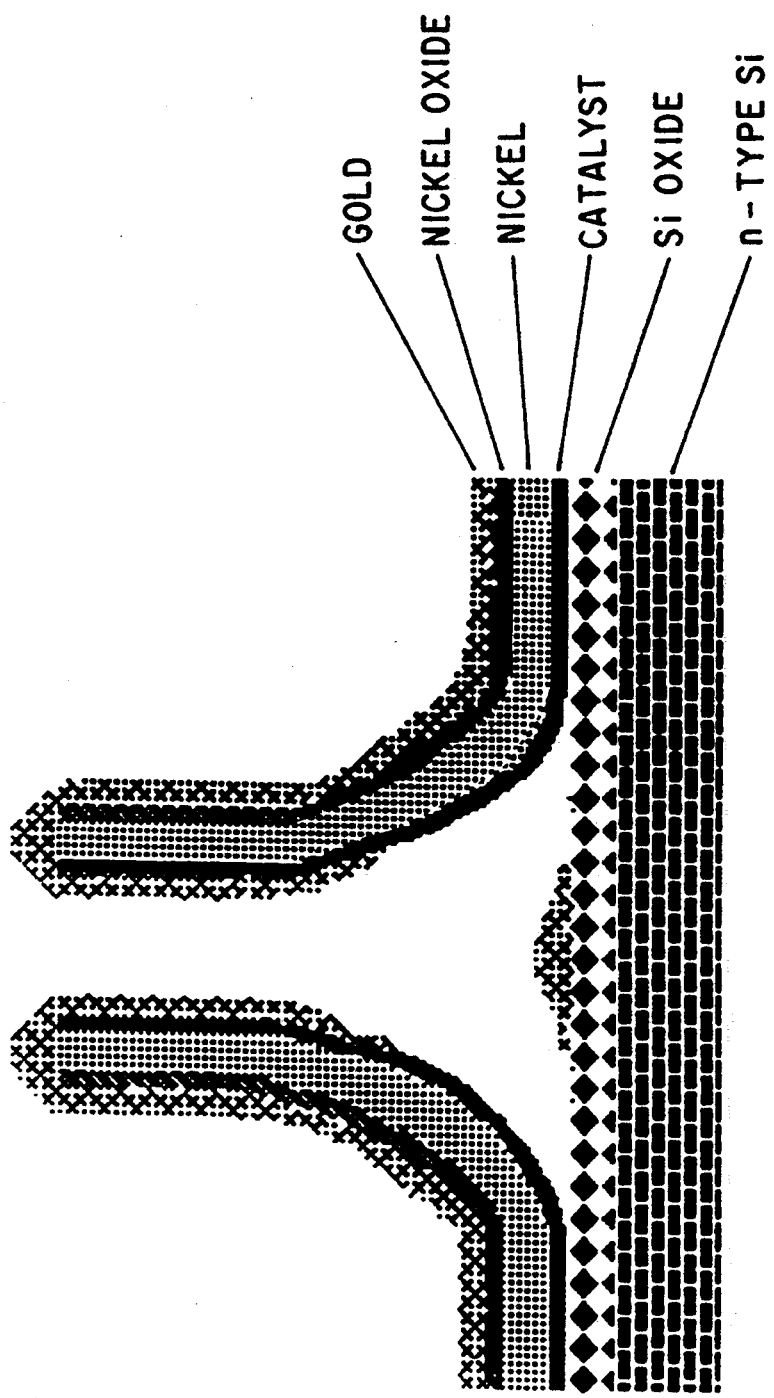
FIG. 8 is a schematic cross section of a preferred embodiment of the present microcylinders.

Characterization of the structures shown in FIGS. 4–7 by XPS depth profiling showed that thin oxide interfaces were present at the gold nickel and nickel-silicon interfaces. A schematic of the cross section of one of the microcylinders, showing the metal and oxide interfaces is illustrated in FIG. 8. Previous work with sharp tips of tantalum silicide with oxide interfaces on the structures revealed destructive melting and ejection of the structures from the surface of the chip during field emission testing. The destructive melting and ejection of the microstructures is presumably due to the oxide interfaces which can cause resistive heating at the metal oxide interfaces resulting in melting and thermal stress.

Example 3: Oxide Free FEA Fabrication and Characterization

In order to eliminate the oxide interfaces in the microcylinder arrays, the following changes in their fabrication was adopted. To make better electrical contact to the silicon substrate, the native silicon oxide must be removed and kept from reforming. This can be accomplished by first removing the native oxide with an HF dip and then evaporating ~500 Å of titaniun onto the wafer surface which getters any remaining oxide. Next ~1500 Å of nickel is evaporated onto the titanium in situ. The nickel acts as a diffusion barrier so that the gold film which follows cannot diffuse into the silicon and form a detrimental silicide. The gold is then evaporated onto the nickel which inhibits oxidation of the nickel and forms a good final electrical contact. The substrate is then annealed at 350° C. for 15 minutes to accelerate the titanium gettering and to promote interdiffusion of the metal interfaces.

Wafers with the Ti/Ni/Au overcoat described above were then processed as described previously to form 10–12 micron tall microcylinders with 1–3 micron wide tip diameters. Immediately following the removal of the photoresist, the substrate was annealed at 300° C. for 10 minutes to promote diffusion of the nickel, tin, and palladium metals into the gold surface and to reduce nickel oxide formation on the microcylinder surface.

The arrays were then cut into chips and mounted on copper stubs as described earlier and placed in a combination directional reactive ion etcher/sputtering chamber. The mounted arrays were then etched with an argon or hydrogen etch to remove any nickel oxide and were then sputtered with ~200 Å of gold. Other mounted arrays went through just the etching step and then were immediately transferred into the field emission test stands.

All microcylinder arrays fabricated using the approach described above demonstrated stable DC field enhanced emission with turn on voltages in the 80–200 Kv/cm and currents in the 50μA range. The structures showed no evidence of damage even after running for 2 hours DC. Both the gold coated and uncoated arrays ran, representing the first demonstration of emission from nickel microstructures. One array was also tested using a phosphorescence screen as the anode which was imaged through a video camera. This demonstrated that the emission was primarily from the metal microstructures and that emission from patterned addressable arrays is possible. XPS depth profiling of the samples described above, before and after field emission, showed that no oxide interfaces were present at the gold-nickel and nickel-gold interfaces. Also arrays that were etched but did not receive a gold overcoat showed that the nickel oxide had been removed, but over a period of days, a new oxide will form that is detrimental to the emission efficiency of the array.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A method for preparing a high aspect ratio metal microstructure, comprising:
   (i) forming a layer of a photoresist on a substrate;
   (ii) exposing said layer to actinic radiation in an imagewise manner to obtain an exposed layer and developing said exposed layer to obtain a surface which comprises an area having no remaining photoresist and an area covered with photoresist, wherein the photoresist, remaining in said area covered with photoresist, is characterized by having a top surface and exposed sides; and
   (iii) metallizing to form a layer of metal on said exposed sides of said photoresist, wherein said metal is selected from the group consisting of Ni, Pd, Cu, Pt, Au, NiB, NiP, and permalloy.

2. The method of claim 1, wherein said exposing to actinic radiation in an imagewise manner is carried out by exposing said layer to actinic radiation through a mask.

3. The method of claim 2, wherein said mask is a pattern of circular dots having a diameter of 0.25 to 13 μm, spaced at a distance of 5 to 10,000 μm between the centers of nearest neighbors.

4. The method of claim 1, wherein said layer of photoresist is 0.5 to 30 μm thick.

5. The method of claim 1, wherein said layer of metal is 100 to 10,000 Å thick.

6. The method of claim 1, further comprising:
   (iv) removing said photoresist remaining in said area covered with photoresist.

7. The method of claim 1, wherein said metallizing is electroless plating.

8. The method of claim 1, wherein said metallizing selectively forms said layer of metal on said exposed sides of said photoresist without forming a metal layer on said top surface.

* * * * *